US00RE47922E

(19) United States
(12) Reissued Patent
Inoue

(10) Patent Number: US RE47,922 E
(45) Date of Reissued Patent: Mar. 31, 2020

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventor: Hideo Inoue, Kanagawa (JP)

(73) Assignee: NuFlare Technology, Inc., Yokohama-shi (JP)

(21) Appl. No.: 15/210,240

(22) Filed: Jul. 14, 2016

Related U.S. Patent Documents

Reissue of:
(64) Patent No.: 8,779,394
Issued: Jul. 15, 2014
Appl. No.: 13/431,509
Filed: Mar. 27, 2012

(30) Foreign Application Priority Data

Mar. 31, 2011 (JP) ..... 2011-078640

(51) Int. Cl.
*G01N 23/00* (2006.01)
*H01J 37/317* (2006.01)
(Continued)

(52) U.S. Cl.
CPC ..... *H01J 37/3174* (2013.01); *B82Y 10/00* (2013.01); *B82Y 40/00* (2013.01);
(Continued)

(58) Field of Classification Search
CPC ..... H01J 37/3174; H01J 2237/3175; H01J 2237/31776; H01J 2237/31762; H82Y 10/00; B82Y 40/00
(Continued)

(56) References Cited

U.S. PATENT DOCUMENTS 4,390,789 A * 6/1983 Smith et al. ..... 250/492.2
4,467,211 A * 8/1984 Smith et al. ..... 250/492.2
(Continued)

FOREIGN PATENT DOCUMENTS

JP 2008-218767 9/2008
JP 2008218767 A * 9/2008
JP 2008218767 A 9/2009

OTHER PUBLICATIONS

U.S. Appl. No. 13/351,786, filed Jan. 17, 2012, Inoue.

*Primary Examiner* — Albert J Gagliardi
(74) *Attorney, Agent, or Firm* — Oblon, McClelland, Maier & Neustadt, L.L.P.

(57) ABSTRACT

A charged particle beam writing apparatus includes a division/distribution processing unit to divide and distribute processed data into data groups each having an approximately equal data amount respectively, transmitting units to transmit the processed data of the groups such that processed data is transmitted in descending order with respect to order of writing processing for each data group and the groups are transmitted in parallel, memories to store the processed data of the groups such that each of the memories stores processed data of each different one of the groups, a writing order data output unit to output them, regardless of data group and in order of writing processing, and a writing unit to write a pattern on a target workpiece with a charged particle beam, based on the processed data output in the order of writing processing.

24 Claims, 5 Drawing Sheets

(51) Int. Cl.
*B82Y 40/00* (2011.01)
*B82Y 10/00* (2011.01)

(52) U.S. Cl.
CPC ..... *H01J 2237/3175* (2013.01); *H01J 2237/31762* (2013.01); *H01J 2237/31776* (2013.01)

(58) Field of Classification Search
USPC ..... 250/492.1, 492.2, 492.22, 492.3, 397
See application file for complete search history.

(56) References Cited

U.S. PATENT DOCUMENTS 4,525,804 A * 6/1985 Mosier et al. ..... 710/66
4,633,090 A * 12/1986 Hahn ..... 250/492.2
4,698,785 A * 10/1987 Desmond et al. ..... 714/38.1
4,996,434 A * 2/1991 Tanaka ..... 250/492.3
5,281,827 A * 1/1994 Kawano et al. ..... 250/492.2
5,424,550 A * 6/1995 Kawano et al. ..... 250/492.22
5,923,678 A * 7/1999 Ishibashi ..... 714/738
5,977,548 A * 11/1999 Oae ..... B82Y 10/00 250/397
6,219,716 B1 * 4/2001 Kumaki ..... 709/246
7,705,327 B2 * 4/2010 Horiuchi ..... B82Y 10/00 250/396 R
7,899,953 B2 * 3/2011 Inoue ..... 710/22
7,949,966 B2 * 5/2011 Anpo et al. ..... 716/50
8,502,175 B2 * 8/2013 Nakayamada et al. .. 250/492.22
2006/0061795 A1 * 3/2006 Walmsley ..... 358/1.14
2006/0143454 A1 * 6/2006 Walmsley ..... 713/170
2007/0083491 A1 * 4/2007 Walmsley et al. ..... 707/3
2008/0221816 A1 * 9/2008 Anpo et al. ..... 702/82
2008/0235535 A1 * 9/2008 Sakai et al. ..... 714/10
2009/0008568 A1 * 1/2009 Abe ..... B82Y 10/00 250/396 R
2010/0148087 A1 * 6/2010 Doering ..... B82Y 10/00 250/396 R
2011/0012031 A1 * 1/2011 Shibata et al. ..... 250/492.3
2011/0253912 A1 * 10/2011 Matsumoto ..... B82Y 10/00 250/492.22
2012/0007002 A1 1/2012 Nakayamada et al.

* cited by examiner

CHARGED PARTICLE BEAM WRITING APPARATUS AND CHARGED PARTICLE BEAM WRITING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is based upon and claims the benefit of priority from the prior Japanese Patent Application No. 2011-078640 filed on Mar. 31, 2011 in Japan, the entire contents of which are incorporated herein by reference.

BACKGROUND OF THE INVENTION

1. Field of the Invention

The present invention relates to a charged particle beam writing apparatus and a charged particle beam writing method, and, for example, it relates to a writing apparatus and method that performs transmission processing of writing data at high speed.

2. Related Art

The microlithography technique which advances micro-miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 4 is a schematic diagram explaining operations of a variable-shaped electron beam (EB) writing apparatus. As shown in the figure, the variable-shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

With the increase in integration of a pattern, a trend towards smaller pattern data to be written to a mask is progressing. When the trend of smaller pattern data progresses, consequently the data amount increases. Therefore, there is a problem that data transmission will be a factor of degrading the writing throughput.

It is conventionally performed that writing data input from outside the apparatus is divided per predetermined calculation region and allocated to a plurality of computers to perform data conversion processing in parallel in a plurality of computers in order to shorten processing time for data conversion (e.g., refer to Japanese Unexamined Patent Publication No. 2008-218767). Then, the data for which data conversion processing has been performed in parallel are collected, rearranged in order of writing, and transferred to a deflection control circuit.

BRIEF SUMMARY OF THE INVENTION

In accordance with one aspect of the present invention, a charged particle beam writing apparatus includes a transmission side unit configured to transmit a plurality of processed data, which were generated by performing data conversion processing in parallel for writing data for each small region made by virtually dividing a writing region into a plurality of small regions, a reception side unit configured to receive the plurality of processed data, a division/distribution processing unit arranged in the transmission side unit and configured to divide and distribute the plurality of processed data into a plurality of data groups each having an approximately equal data amount respectively, a plurality of transmitting units arranged in the transmission side unit and configured to transmit the plurality of processed data of the plurality of data groups such that at least one processed data which has been divided and distributed to each of the plurality of data groups is transmitted in descending order with respect to order of writing processing for each data group and the plurality of data groups are transmitted in parallel, a plurality of memories arranged in the reception side unit and configured to store the plurality of processed data of the plurality of data groups having been transmitted in parallel such that each of the plurality of memories stores processed data of each different one of the plurality of data groups, a writing order data output unit arranged in the reception side unit and configured to read out the plurality of processed data from the plurality of memories and output them, regardless of data group and in order of writing processing, and a writing unit configured to write a pattern on a target workpiece with a charged particle beam, based on each of the plurality of processed data output in the order of writing processing.

In accordance with another aspect of the present invention, a charged particle beam writing method includes dividing and distributing a plurality of processed data, which were generated by respectively performing data conversion processing for writing data for each region, into a plurality of data groups each having an approximately equal data amount respectively, in a transmission side unit, transmitting the plurality of processed data of the plurality of data groups such that at least one processed data distributed to each of the plurality of data groups is transmitted in descending order with respect to a writing order for each data group and the plurality of data groups are transmitted in parallel, from the transmission side unit, storing the plurality of processed data of the plurality of data groups, which have been transmitted in parallel, such that processed data of each different one of the plurality of data groups is stored, in a reception side unit, reading out the plurality of processed data from the plurality of memories and outputting them, regardless of data group and in order of writing processing, in the reception side unit, and writing a pattern on a target workpiece with a charged particle beam, based on each of the plurality of processed data output in the order of writing processing.

DETAILED DESCRIPTION OF THE INVENTION

Figure 5:
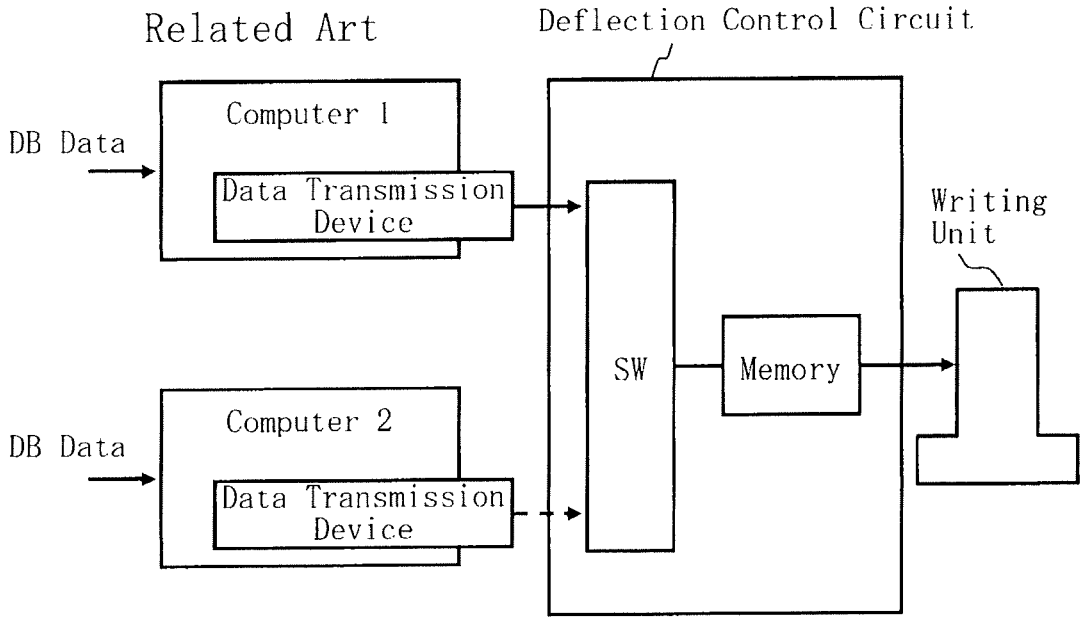
FIG. 5 is a schematic diagram explaining data transfer of a writing apparatus.

FIG. 5 is a schematic diagram explaining an example of data transfer of a writing apparatus, as a comparison example. Each computer for data conversion is respectively connected to a computer for data transfer which transfers data to a deflection control circuit for controlling deflection. A data transmission device is installed in each of data transfer computers 1 and 2. In contrast, a receiving device is installed in the deflection control circuit at the receiving side. Received data is buffered in a memory to be transmitted to the writing unit. In the writing apparatus of the structure above described, first, data is prepared by the computer 1. Then, the data arranged in order of writing is transferred to the deflection control circuit from the computer 1. In that case, at the receiving side, a switch for the receiving channel is connected to the computer 1 side in order to receive the data from the computer 1. While the data transfer is performed by the computer 1, data to be transferred is prepared in the computer 2. After completing the preparation, it is waited until the transfer by the computer 1 is finished. Then, after the data transfer by the computer 1 is finished, next, at the receiving side, the switch for the receiving channel is switched to be connected to the computer 2 side in order to receive the data from the computer 2 and transfer the data arranged in order of writing to the deflection control circuit from the computer 2. While the data transfer is performed by the computer 2, data to be transferred next is prepared in the computer 1. Thus, data of the computers 1 and 2 is alternately transferred, and it is repeated that while one computer performs transfer processing, the other one performs data preparation. In the deflection control circuit, data is stored in order of input in the memory, and writing processing is performed in the order of input.

However, in the case of data transfer in the structure as shown in FIG. 5, the data transfer processing is certainly performed as a one-line system (not in parallel). Therefore, even when data conversion processing is calculated in parallel, processing after the data conversion becomes data transfer of one line. Since the transfer speed is determined based on data transfer capability of the one line, it is difficult to obtain a sufficient transfer speed. Consequently, when the data amount increases, the writing time also increases due to delay of data transfer, thereby decreasing the throughput of the writing apparatus. In the writing apparatus, since a computer for data conversion processing needs to be arranged apart from the deflection control circuit which performs deflection control, it is required to perform data transfer at high speed after the data conversion processing.

In the following Embodiment, there will be described a writing apparatus and a writing method that can efficiently parallelize data transfer to increase the transfer speed and thereby to enhance the throughput of writing.

In the following Embodiment, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

Embodiment 1

Figure 1:
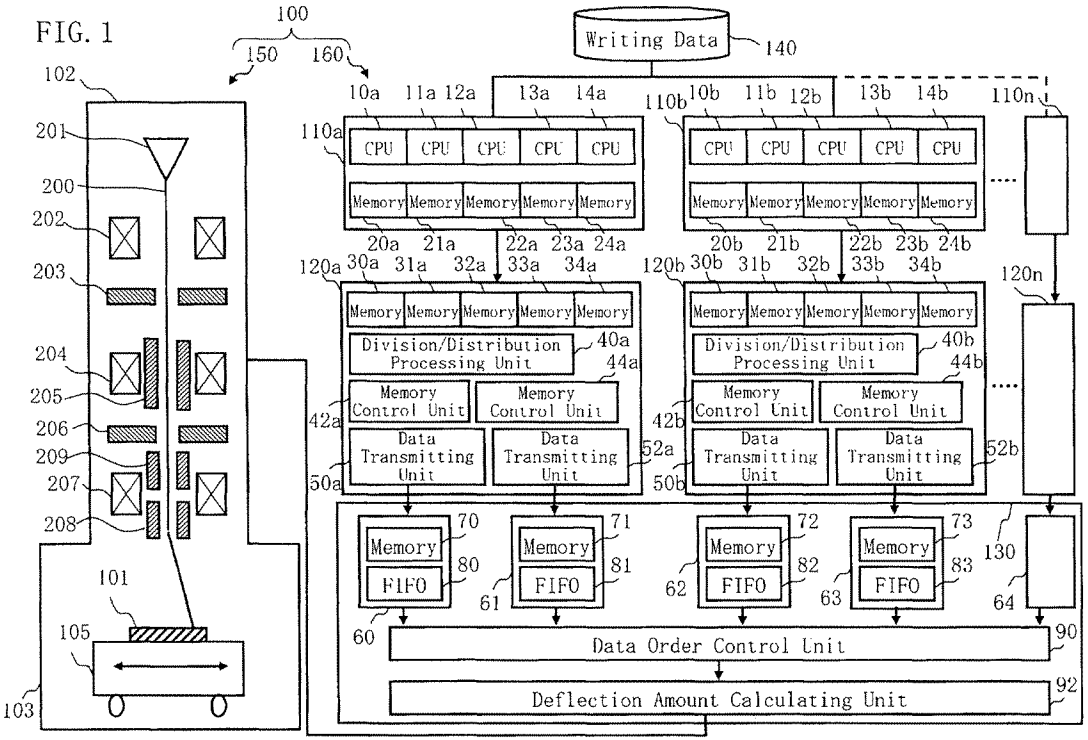
FIG. 1 is a schematic diagram showing a structure of a writing apparatus according to Embodiment 1.

FIG. 1 is a schematic diagram showing a structure of a writing or "drawing" apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped electron beam writing apparatus. The writing unit 150 includes an electron lens barrel 102 and a writing chamber 103. In the electron lens barrel 102, there are arranged an electron gun 201, an illumination lens 202, a first aperture plate 203, a projection lens 204, a deflector 205, a second aperture plate 206, an objective lens 207, a main deflector 208, and a sub deflector 209. In the writing chamber 103, there is arranged an XY stage 105, on which a target workpiece 101, such as a mask, serving as a writing target is placed. The target workpiece 101 is, for example, a mask for exposure used for manufacturing semiconductor devices, or a mask blank on which resist has been coated and no pattern has yet been formed.

The control unit 160 includes a plurality of control computer units 110a-n, a plurality of data transfer computer units 120a-n, a deflection control circuit 130 (deflection calculation unit), and a memory 140 such as a magnetic disk drive. They are mutually connected through buses (not shown).

In each of a plurality of control computer units 110a-n, there are arranged a plurality of CPUs 10-14 and a plurality of memories 20-24. In each of the plurality of data transfer computer units 120a-n, there are arranged a plurality of memories 30-34, a division/distribution processing unit 40, a plurality of memory control units 42 and 44, and a plurality of data transmitting units 50 and 52 (an example of a transmitting device). The number of the arranged plurality of memory control units 42 and 44 and the number of the arranged plurality of data transmitting units 50 and 52 are the same. Functions, such as the division/distribution processing unit 40 and the plurality of memory control units 42 and 44, may be configured by hardware such as an electronic circuit or by software such as a program executing these functions. Alternatively, they may be configured by a combination of hardware and software. Information input/output from/to the division/distribution processing unit 40 and the plurality of memory control units 42 and 44, and information being currently calculated are stored in a memory (not shown) each time. Each of the plurality of data transfer computer units 120a-n serves as an example of a transmission side unit.

In the deflection control circuit 130, there are arranged a plurality of receiving units 60-64 (an example of a receiving device), a data order control unit 90, and a deflection amount calculating unit 92. Functions, such as the data order control unit 90 and the deflection amount calculating unit 92, may be configured by hardware such as an electronic circuit or by software such as a program executing these functions. Alternatively, they may be configured by a combination of hardware and software. Information input/output from/to the data order control unit 90 and the deflection amount calculating unit 92, and information being currently calculated are stored in a memory (not shown) each time.

In each of the plurality of receiving units 60-64, a memory and a first-in first-out (FIFO) circuit are arranged as a pair. In the receiving unit 60, a memory 70 and a FIFO circuit 80 are arranged. Similarly, in the receiving unit 61, a memory 71 and a FIFO circuit 81 are arranged. In the receiving unit 62, a memory 72 and a FIFO circuit 82 are arranged. In the receiving unit 63, a memory 73 and a FIFO circuit 83 are arranged. Description of the internal configuration of the receiving unit 64 is omitted. It is preferable that the number of the plurality of receiving units 60-64 is greater than or equal to the total number of the data transmitting units 50 and 52 in all the data transfer computer units 120a-n. The deflection control circuit 130 serves as an example of a reception side unit.

As described above, FIG. 1 shows a structure necessary for explaining Embodiment 1. Other structure elements generally necessary for the writing apparatus 100 may also be included. For example, although a multiple stage deflector namely the two stage deflector of the main deflector 208 and the sub deflector 209 is herein used for position deflection, a single stage deflector or a multiple stage deflector of three or more stages may also be used to perform position deflection.

In the storage device 140, stored is writing data which is input from the outside and in which positions, sizes, etc. of a plurality of figure patterns are defined. The writing region of the target workpiece 101 is divided into a plurality of calculation processing regions (DPB). Writing processing is executed for each stripe region made by virtually dividing the writing region in the x or y direction into a plurality of strip-shaped stripe regions each having a width being able to be deflected by the main deflector 208. It is preferable to treat, as a DPB, a region made by virtually dividing a stripe region into block-shaped regions.

Each of the CPUs 10-14 in each of the plurality of control computer units 110a-n respectively reads out writing data corresponding to each DPB from the storage device 140, and performs data conversion processing of a plurality of steps to generate shot data unique to the apparatus. By executing the data processing in parallel, the data processing can be performed at high speed. When writing a figure pattern by the writing apparatus 100, it is necessary to divide each figure pattern, defined in writing data, to have a size that can be irradiated by one beam shot. Therefore, each of the CPUs 10-14 in each of the control computer units 110a-n divides a figure pattern indicated by writing data to have a size that can be irradiated by one beam shot, in order to generate a shot figure. Then, shot data is generated for each shot figure. In the shot data, there is defined figure data, such as a figure type, a figure size, an irradiation position, and a dose. Further, according to Embodiment 1, writing order information indicating a writing order is defined in the header of each shot data.

Figure 2:
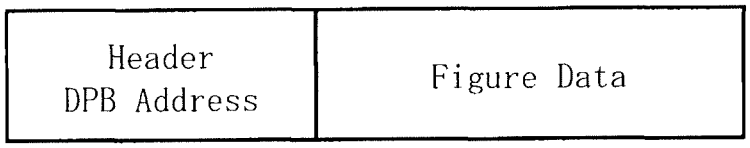
FIG. 2 shows an example of a format of shot data according to Embodiment 1.

FIG. 2 shows an example of a format of shot data according to Embodiment 1. In FIG. 2, writing order information is placed in the header of each shot data. For example, DPB information is defined, and then, a writing order is represented according to the DPB information. For example, when DPB information is defined for each stripe region, further, stripe region information is also defined. It is preferable to use, for example, a DPB address as DPB information. Writing processing is performed for each DPB in order of increasing position indicated by the address from the smallest, for example. Alternatively, writing processing is performed for each DPB in order of increasing distance of the position indicated by the address from the closest to the writing starting position of each stripe region, for example. Alternatively, it is also preferable to define a number for each of a plurality of DPBs such that each number indicates the order of writing processing of a DPB concerned.

Then, figure data, such as a figure type, a figure size, an irradiation position, and a dose, is defined after the header. Shot data calculated by each of the CPUs 10-14 in each of the control computer units 110a-n is stored respectively in one of the memories 20-24 each being corresponding to one of the CPUs respectively.

FIGS. 3A to 3D are schematic diagrams explaining transfer processing of shot data according to Embodiment 1. FIGS. 3A to 3D respectively show the control computer unit 110a in the plurality of control computer units 110a-n. Moreover, they respectively show the data transfer computer unit 120a corresponding to the control computer unit 110a in the plurality of data transfer computer units 120a-n. The other control computer units 110b-n operate similarly to the control computer unit 110a, and the other data transfer computer units 120b-n operate similarly to the data transfer computer unit 120a.

Figure 3A:
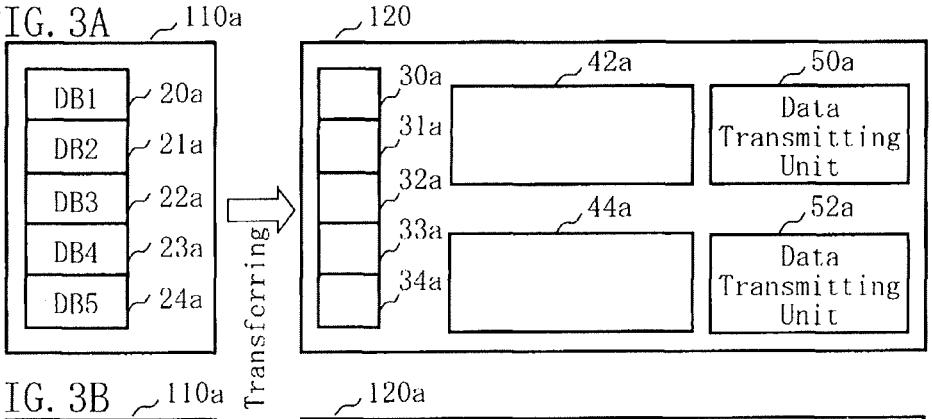
FIG. 3A to FIG. 3D are schematic diagrams explaining transfer processing of shot data according to Embodiment 1.

In FIG. 3A, at least one shot data for a shot figure to be arranged in a corresponding DPB is stored in each of memories 20a-24a in the control computer unit 110a, and thereby a DB (data block) is configured. For example, at least one shot data (DB1 data), configuring DB1, for a shot figure to be arranged in a certain DPB is stored in the memory 20a. At least one shot data (DB2 data), configuring DB2, for a shot figure to be arranged in a certain DPB is stored in the memory 21a. At least one shot data (DB3 data), configuring DB3, for a shot figure to be arranged in a certain DPB is stored in the memory 22a. At least one shot data (DB4 data), configuring DB4, for a shot figure to be arranged in a certain DPB is stored in the memory 23a. At least one shot data (DB5 data), configuring DB5, for a shot figure to be arranged in a certain DPB is stored in the memory 24a. These DB data are respectively transferred to one of the memories 30a-34a in the corresponding data transfer computer unit 120a. This transfer is performed in parallel processing. The data transfer computer unit 120a functions as a computer unit for transmitting data to be transferred from the control computer unit 110a to the deflection control circuit 130 side.

Figure 3B:
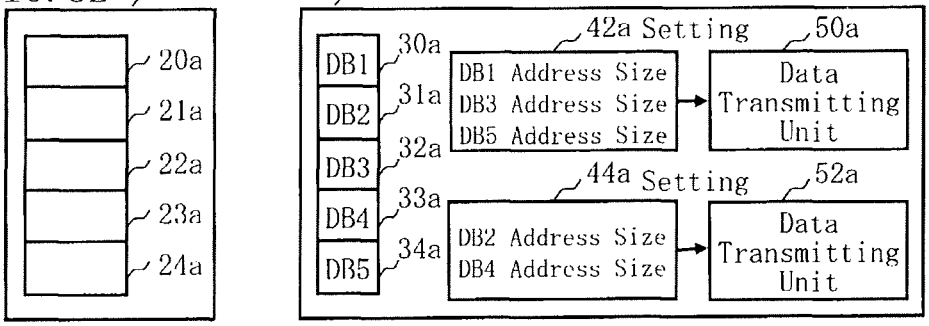

FIG. 3B shows the state where a parallel transfer from the memory in the control computer unit 110a to the memory in the data transfer computer unit 120a has been completed. In the data transfer computer unit 120a, at least one shot data (DB1 data), configuring DB1, for a shot figure to be arranged in a certain DPB is stored in the memory 30a. At least one shot data (DB2 data), configuring DB2, for a shot figure to be arranged in a certain DPB is stored in the memory 31a. At least one shot data (DB3 data), configuring DB3, for a shot figure to be arranged in a certain DPB is stored in the memory 32a. At least one shot data (DB4 data), configuring DB4, for a shot figure to be arranged in a certain DPB is stored in the memory 33a. At least one shot data (DB5 data), configuring DB5, for a shot figure to be arranged in a certain DPB is stored in the memory 34a. The data transfer computer unit 120a transmits a plurality of processed data (DB data), having been generated by respectively performing data conversion processing for writing data for each DPB made by virtually dividing the writing region into a plurality of DPBs, to the deflection control circuit 130. The data transfer computer unit 120a serves as an example of a transmission side unit.

When each DB data has been respectively stored in the memories 30a-34a in the data transfer computer unit 120a, the division/distribution processing unit 40a arranged in the data transfer computer unit 120a divides the plurality of DB data into a plurality of data groups each having an approximately equal data amount respectively. As a result of adjusting the data amount to be approximately equal, the data of DB1, DB3, and DB5 are distributed to form one data group, for example. Then, the data of DB2 and DB4 are distributed to form another data group. With respect to DBs of one data group formed (divided and distributed) by the division/distribution processing unit 40a, the memory control unit 42a defines their addresses and sizes in sequence such that the order of writing processing becomes a descending order. For example, when advancing the writing processing in the order of DB1, DB2, DB3, DB4, and DB5, the memory control unit 42a defines, in the order of descending, the address and size of DB1, the address and size of DB3, and the address and size of DB5. The order of the writing processing is never defined in non-descending order such as the address and size of DB1, the address and size of DB5 and the address and size of DB3. Thus, for each data group, the memory control unit 42a defines in sequence the addresses of distributed processed data such that the writing processing order of the distributed processed data is a descending order, thereby managing a plurality of processed data stored in a plurality of memories.

Similarly, with respect to the DBs of the other data group formed (divided and distributed) by the division/distribution processing unit 40a, the memory control unit 44a defines their addresses and sizes in sequence such that the order of writing processing becomes a descending order. Similarly, for example, when advancing the writing processing in the order of DB1, DB2, DB3, DB4, and DB5, the memory control unit 44a defines, in the order of descending, the address and size of DB2, and then the address and size of DB4. The order of writing processing is never defined in non-descending order such as the address and size of DB4 and then the address and size of DB2. Thus, for each data group, the memory control unit 44a defines in sequence the addresses of distributed processed data such that the writing processing order of the distributed processed data is a descending order, thereby managing a plurality of processed data stored in a plurality of memories.

The memory control unit 42a sets the defined DB order in its own corresponding data transmitting unit 50a. In other words, it is set in the data transmitting unit 50a to perform data transmission in the order of DB1, DB3, and DB5. Similarly, the memory control unit 44a sets the defined DB order in its own corresponding data transmitting unit 52a. In other words, it is set in the data transmitting unit 52a to perform data transmission in the order of DB2 and DB4. Thus, each of the memory control units 42a and 44a sets the order of transmission of its own corresponding data transmitting unit 50a or 52a.

Figure 3C:
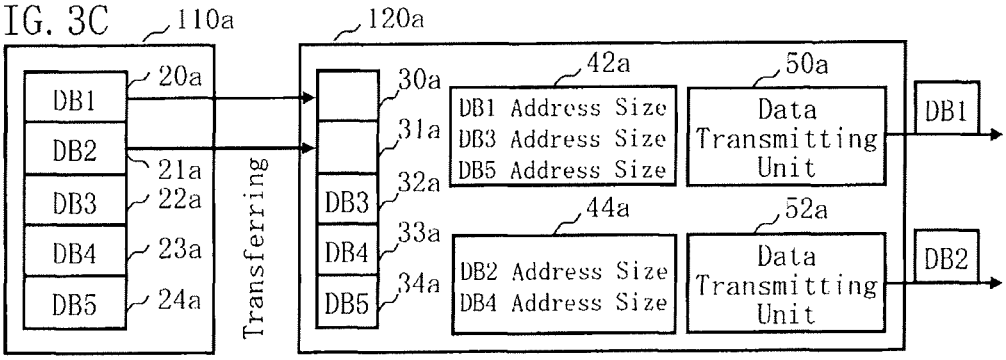

Then, the plurality of transmitting units 50a and 52a arranged in the transmission side unit transmit, in parallel, DB data of the plurality of data groups such that at least one DB data distributed to each data group is transmitted in descending order with respect to a writing processing order. FIG. 3C shows the state in which the transmitting unit 50a reads out the DB1 data from the memory 30a and transmits (or transfers) it to the deflection control circuit 130 side, and in parallel with it, the transmitting unit 52a reads out the DB3 data from the memory 31a and transmits (or transfers) it to the deflection control circuit 130 side. Then, while the transmission processing is being implemented in the data transfer computer unit 120a serving as a transmission side unit, the next DB data is calculated in the control computer unit 110a and stored in the memories 20a-24a in order. For example, DB6 data is stored in the memory 20a, DB7 data is stored in the memory 21a, DB8 data is stored in the memory 22a, DB9 data is stored in the memory 23a, and DB10 data is stored in the memory 24a.

Then, the next data of DB6 is transmitted to the memory 30a which has become empty because the DB1 data was read out from the memory 30a by the transmitting unit 50a. Similarly, the next data of DB7 is transmitted to the memory 31a which has become empty because the DB2 data was read out from the memory 31a by the transmitting unit 52a.

After completing the transmission of DB1 data, the transmitting unit 50a reads out DB3 data from the memory 32a and transmits (or transfers) it to the deflection control circuit 130 side, and after completing the transmission of DB3 data, reads out DB5 data from the memory 34a and transmits (or transfers) it to the deflection control circuit 130 side. Then, in the deflection control circuit 130 serving as a reception side unit, the receiving device 60 receives the DB data in the order of DB1, DB3, and DB5. As described above, DB data is transmitted in descending order, for each distributed data group. In parallel with the transmission processing of the transmitting unit 50a, after completing the transmission of DB2 data, the transmitting unit 52a reads out DB4 data from the memory 33a and transmits (or transfers) it to the deflection control circuit 130 side. Then, in the deflection control circuit 130 serving as a reception side unit, the receiving device 61 receives the DB data in the order of DB2 and DB4. As described above, DB data is transmitted in descending order, for each distributed data group. Thus, to the memories 30a-34a that have become empty because of completing the transmission processing by the data transfer computer unit 120a serving as a transmission side unit, the next calculated DB data is transmitted one by one. For example, each of the memory control units 42a and 44a, after completing the DB data transmission processing defined in itself, transmits information indicating the completion of the transmission to the computer unit 110a, thereby informing that the memory having been used for storing the DB data which has now been transmitted is currently empty. Then, in the computer unit 110a side, next DB data is transmitted to the empty area in the memory.

Figure 3D:
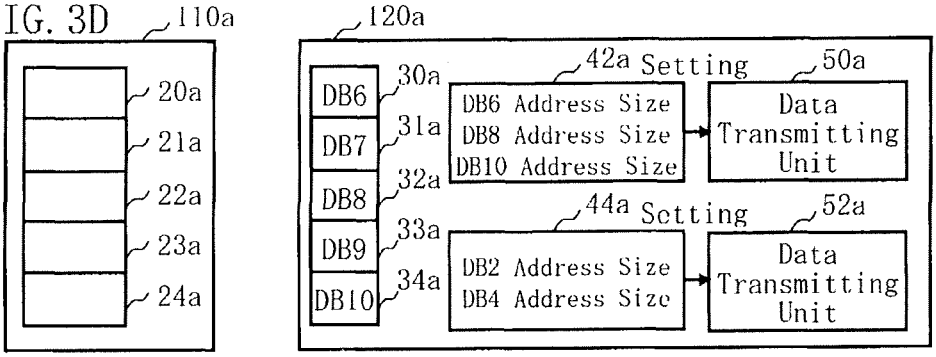
Figure 4:
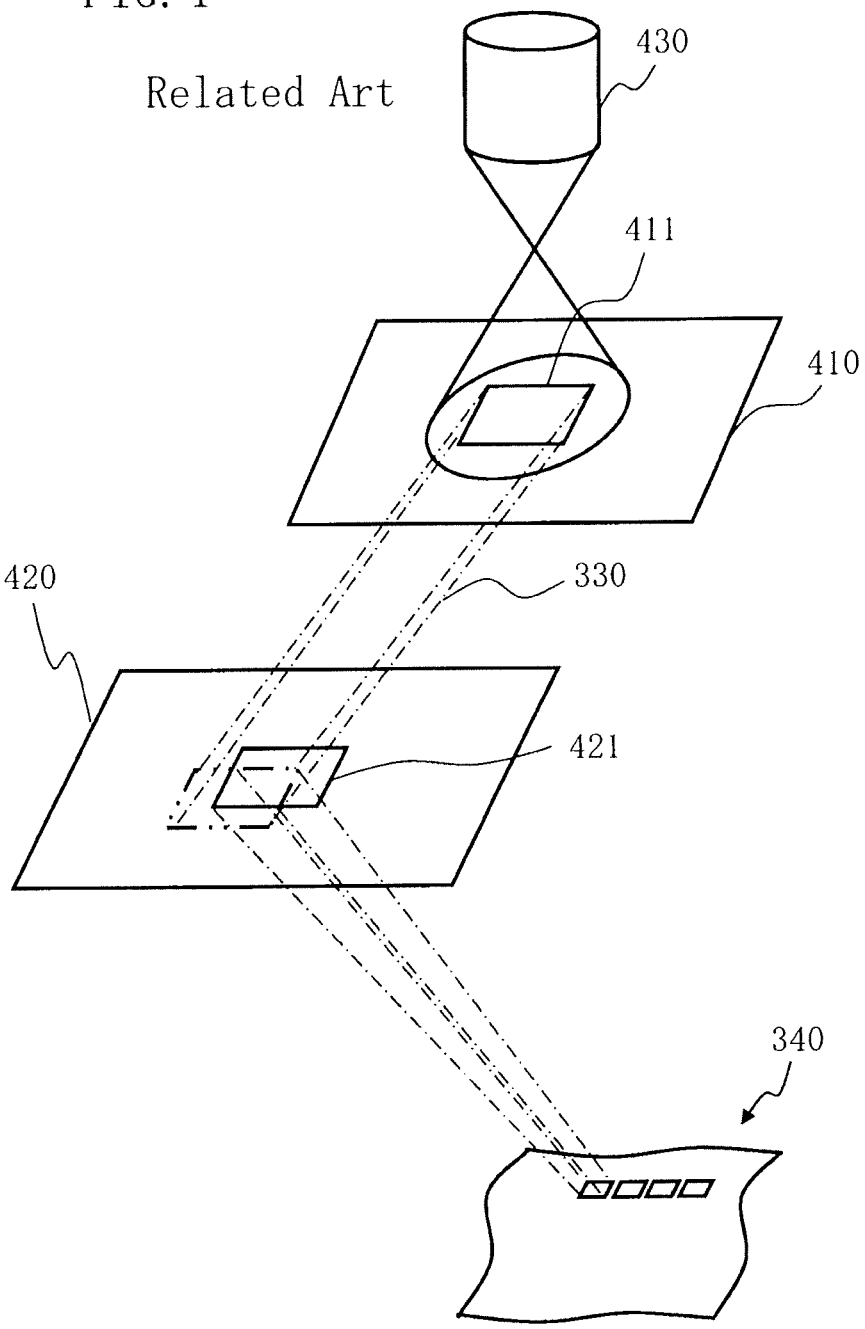
FIG. 4 Related Art
FIG. 4 is a schematic diagram explaining operations of a variable-shaped electron beam writing apparatus.

As described above, when the next DB data of DB6 to DB10 are respectively stored in the memories 30a-34a in the data transfer computer unit 120a as shown in FIG. 3D, the division/distribution processing unit 40a arranged in the data transfer computer unit 120a divides the plurality of DB data into a plurality of data groups each having an approximately equal data amount. As a result of adjusting the data amount to be approximately equal, the data of DB6, DB8, and DB10 are distributed to form one data group, for example. Then, the data of DB7 and DB9 are distributed to form another data group. With respect to DBs of one data group formed (divided and distributed) by the division/distribution processing unit 40a, the memory control unit 42a defines their addresses and sizes in sequence such that the order of writing processing becomes a descending order. For example, when advancing the writing processing in the order of DB6, DB7, DB8, DB9, and DB10, the memory control unit 42a defines, in the order of descending, the address and size of DB6, the address and size of DB8, and the address and size of DB10. Similarly, with respect to the DBs of the other data group formed (divided and distributed) by the division/distribution processing unit 40a, the memory control unit 44a defines their addresses and sizes in sequence such that the order of writing processing becomes a descending order. Similarly, for example, the memory control unit 44a defines, in the order of descending, the address and size of DB7, and then the address and size of DB9.

The memory control unit 42a sets the defined DB order in its own corresponding data transmitting unit 50a. In other words, it is set in the data transmitting unit 50a to perform data transmission in the order of DB6, DB8, and DB10. Similarly, the memory control unit 44a sets the defined DB order in its own corresponding data transmitting unit 52a. In other words, it is set in the data transmitting unit 52a to perform data transmission in the order of DB7 and DB9.

Then, the plurality of transmitting units 50 and 52 arranged in the transmission side unit transmit, in parallel, DB data of the plurality of data groups such that at least one DB data distributed to each data group is transmitted in descending order with respect to the writing processing order.

In parallel with the processing between the control computer unit 110a and the data transfer computer unit 120a and the processing of transmission (processing of transfer) from the data transfer computer unit 120a (first transmission side unit) to the deflection control circuit 130 serving as a reception side unit, there are performed respective processing between the control computer units 110b-n of the plurality of control computer units 110 and their own corresponding data transfer computer units 120b-n of the plurality of data transfer computer units 120 and processing of transmission (processing of transfer) from the data transfer computer units 120b-n (the second, third, . . . , n-th transmission side unit) to the deflection control circuit 130 serving as a reception side unit. In FIG. 1, a plurality of DB data of a certain data group transmitted from the transmitting unit 50b are received by the receiving device 62 in the deflection control circuit 130 such that the receiving of the plurality of DB data is in descending order for the data group concerned. A plurality of DB data of a certain data group transmitted from the transmitting unit 52b are received by the receiving device 63 in the deflection control circuit 130 such that the receiving of the plurality of DB data is in descending order for the data group concerned. A plurality of DB data of a certain data group transmitted from the data transfer computer unit 120b to the deflection control circuit 130 serving as a reception side unit are received by the receiving device 63 in the deflection control circuit 130 such that the receiving of the plurality of DB data is in descending order for the data group concerned. As described above, the deflection control circuit 130 serving as a reception side unit receives a plurality of DB data.

Then, with respect to DB data of a plurality of data groups transmitted in parallel to the deflection control circuit 130, each memory in each receiving device stores DB data of each different one of the plurality of data groups. Thus, the first transmission side unit respectively transmits a plurality of DB data from a plurality of transmitting units, in parallel with the transmission of the second and subsequent transmission side units, and each of a plurality of memories in the reception side unit stores DB data of a plurality of data groups transmitted in parallel from the plurality of transmission side units such that DB data is stored in a different memory for each data group and each transmission side unit.

Each memory in each of the receiving devices 60-64 stores figure data in DB data of its own corresponding data group. On the other hand, each FIFO circuit in each of the receiving devices stores writing order information defined in the header of DB data of its own corresponding data group. For example, the memory 70 in the receiving device 60 stores figure data in shot data being each DB data, in the order of DB1, DB3, and DB5. On the other hand, the FIFO circuit 80 in the receiving device 60 stores writing order information defined in the header of shot data being each DB data, in the order of DB1, DB3, and DB5. Similarly, the memory 71 in the receiving device 61 stores figure data in shot data being each DB data, in the order of DB2 and DB4. On the other hand, the FIFO circuit 81 in the receiving device 61 stores writing order information defined in the header of shot data being each DB data, in the order of DB2 and DB4. Similar operations are performed in the subsequent receiving devices 62-64.

Next, the data order control unit 90 in the deflection control circuit 130 reads out a plurality of DB data from the plurality of memories 70-73, regardless of the data group and in order of writing processing, and outputs them to the deflection amount calculating unit 92 in order of the reading. The data order control unit 90 is an example of a writing order data output unit. Concretely, the data order control unit 90 reads out a plurality of DB data from the plurality of memories 70-73 etc. regardless of the data group and in order of writing processing, based on writing order information output from the FIFO circuits 80-83 etc. Further, concretely, it operates as follows: The data order control unit 90, first, inputs DPB information, which may include stripe region information, output from the FIFO circuits 80-83 etc. Then, the data order control unit 90 reads out DB data of the input DPB information in the order of writing order from the earliest to the latest. For example, header information of DB1 is output from the FIFO circuit 80, and header information of DB2 is output from the FIFO circuit 81. Therefore, the data order control unit 90 can know that the order of writing processing of DB1 is prior to that of DB2. Thus, the data order control unit 90 reads out DB1 data from the memory 70, and outputs it to the deflection amount calculating unit 92. When the DB1 data is read out, header information of DB3 is output from the FIFO circuit 80. Therefore, the data order control unit 90 can know that the order of writing processing of DB2 is prior to that of DB3. Thus, the data order control unit 90 reads out DB2 data from the memory 71, and outputs it to the deflection amount calculating unit 92. When the DB2 data is read out, header information of DB4 is output from the FIFO circuit 81. Therefore, the data order control unit 90 can know that the order of writing processing of DB3 is prior to that of DB4. Thus, the data order control unit 90 reads out DB3 data from the memory 70, and outputs it to the deflection amount calculating unit 92. Hereafter, similarly, the data order control unit 90 reads out and outputs DB data, regardless of the data group and in order of writing processing.

As described above, according to Embodiment 1, data transmission can be performed in parallel from the plurality of computer units 120a-n to the deflection control circuit 130. Therefore, a plurality of processed data can be transmitted in parallel. Simultaneously, also in each computer unit 120, data transmission can be performed in parallel from the plurality of transmitting units 50 and 52 to the deflection control circuit 130. Thus, according to Embodiment 1, it is possible to highly increase the transfer speed of a plurality of processed data from the plurality of computer units 120a-n (transmission side unit) to the deflection control circuit 130 (reception side unit). Therefore, the writing time can be shortened and the throughput of the writing apparatus can be improved.

Moreover, by making each of divided data amounts approximately equal when the division/distribution processing unit 40 divides DB data, it becomes possible to eliminate data transfer bias and avoid a state where the whole transmission speed is limited by a line transmitting data of a large amount. Therefore, data transfer can be performed at high speed. In that case, by transmitting, in descending order, DB data in each of the divided data groups, the FIFO circuit in the reception side can output headers in the order of writing processing. Thus, even when a plurality of DB data are transmitted in parallel, the data order control unit 90 can know the order of writing processing, based on headers output from a plurality of FIFO circuits, and read out DB data in the order of the writing processing.

The deflection amount calculating unit 92 calculates, in the order of input, an amount of deflection of each deflector by using shot data in a DPB concerned. Thus, by performing as described above, the amount of deflection when shooting a beam to each position is calculated. The writing unit 150 writes a pattern on the target workpiece 101 with an electron beam 200, based on each processed data which was output in the order of writing processing. Specifically, it operates as follows:

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After having passed through the second aperture plate 206, the electron beam 200 of a second aperture image is focused by the objective lens 207 and deflected by the main deflector 208 and the sub deflector 209, and reaches a desired position on the target workpiece 101 on the XY stage 105 which moves continuously. FIG. 1 shows the case of using a multiple stage deflection, namely the two stage deflector of the main and sub deflectors, for the position deflection. In such a case, what is needed is to deflect the electron beam 200 of a shot concerned to the reference position of a subfield (SF), which is made by virtually dividing the writing region, by the main deflector 208 while following the stage movement, and to deflect the beam of the shot concerned to each irradiation position in the SF by the sub deflector 209.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A charged particle beam writing apparatus for writing to small regions of a target, comprising:

a transmission side unit configured to transmit a plurality of processed data, which were generated by performing data conversion processing in parallel for writing data for each small region made by virtually dividing a writing region into a plurality of small regions;

a reception side unit configured to receive the plurality of processed data;

a division/distribution processing unit arranged in the transmission side unit and configured to divide and distribute the plurality of processed data into a plurality of data groups each having an approximately equal data amount respectively;

a plurality of transmitting units arranged in the transmission side unit and configured to transmit the plurality of processed data of the plurality of data groups such that at least one processed data which has been divided and distributed to each of the plurality of data groups is transmitted in descending order with respect to order of writing processing for each data group and the plurality of data groups are transmitted in parallel;

a plurality of memories arranged in the reception side unit and configured to store the plurality of processed data of the plurality of data groups having been transmitted in parallel such that each of the plurality of memories stores processed data of each different one of the plurality of data groups;

a writing order data output unit arranged in the reception side unit and configured to read out the plurality of processed data from the plurality of memories and output them, regardless of data group and in order of writing processing; and a writing unit configured to write a pattern on a target workpiece with a charged particle beam, based on each of the plurality of processed data output in the order of writing processing.

2. The apparatus according to claim 1 further comprising:

a control computer unit configured to perform data conversion processing in parallel for the writing data for the each small region, wherein the transmission side unit transmits the plurality of processed data generated by performing the data conversion processing in parallel by the control computer unit.

3. The apparatus according to claim 2, wherein the control computer unit includes a plurality of CPUs for performing data conversion processing and a plurality of memories corresponding to the plurality of CPUs, and the plurality of processed data, for which data conversion processing has been performed by the plurality of CPUs, are respectively stored in each corresponding memory of the plurality of memories so as to configure a data block in the each corresponding memory.

4. The apparatus according to claim 3, wherein the plurality of processed data stored in the plurality of memories in the control computer unit are transferred in parallel to the transmission side unit.

5. The apparatus according to claim 4, wherein the transmission side unit includes a plurality of memories, and the plurality of processed data stored in the plurality of memories in the control computer unit are to be stored in the plurality of memories in the transmission side unit.

6. The apparatus according to claim 5, wherein the division/distribution processing unit divides and distributes the plurality of processed data stored in the plurality of memories into the plurality of data groups each having an approximately equal data amount respectively.

7. The apparatus according to claim 6 further comprising:

a plurality of memory control units each configured to control each of the plurality of processed data stored in the plurality of memories by defining in sequence addresses of the plurality of processed data, having been divided and distributed to each of the plurality of data groups, such that order of writing processing of the plurality of processed data, having been divided and distributed, is a descending order.

8. The apparatus according to claim 7, wherein each of the plurality of memory control units performs setting to transmit the at least one processed data in a data group concerned in an order defined in a corresponding transmitting unit in the plurality of transmitting units.

9. The apparatus according to claim 1 further comprising:

a second transmission side unit, when defining the transmission side unit according to claim 1 as a first transmission side unit, configured to include a division/distribution processing unit which is similar to the division/distribution processing unit according to claim 1, and a plurality of transmitting units which are similar to the plurality of transmitting units according to claim 1, wherein the first transmission side unit transmits the plurality of processed data from its own plurality of transmitting units respectively, in parallel with the second transmission side unit, and each of the plurality of memories stores processed data of each of the plurality of data groups transmitted in parallel from the first and second transmission side units such that the processed data is stored in a different memory for each of the plurality of data groups and each of the first and second transmission side units.

10. The apparatus according to claim 9 further comprising:

first and second control computer units each configured to perform data conversion processing in parallel for the writing data for the each small region, wherein the first transmission side unit transmits a plurality of processed data generated by performing the data conversion processing in parallel by the first control computer unit, and the second transmission side unit transmits a plurality of processed data generated by performing the data conversion processing in parallel by the second control computer unit.

11. The apparatus according to claim 10, wherein each of the first and second control computer units includes a plurality of CPUs for performing data conversion processing and a plurality of memories corresponding to the plurality of CPUs, and the plurality of processed data, for which data conversion processing has been performed by the plurality of CPUs, are respectively stored in each corresponding memory of the plurality of memories so as to configure a data block in the each corresponding memory.

12. The apparatus according to claim 11, wherein a plurality of data block data stored in the plurality of memories in the first control computer unit are transferred in parallel to the first transmission side unit, and a plurality of data block data stored in the plurality of memories in the second control computer unit are transferred in parallel to the second transmission side unit.

13. The apparatus according to claim 12, wherein each of the first and second transmission side units includes a plurality of memories, the plurality of data block data stored in the plurality of memories in the first control computer unit are stored in the plurality of memories of the first transmission side unit, and the plurality of data block data stored in the plurality of memories in the second control computer unit are stored in the plurality of memories of the second transmission side unit.

14. The apparatus according to claim 1, wherein at least one of shot data for one shot of the charged particle beam is defined in each of the plurality of processed data, and writing order information indicating order of writing processing and figure data of a figure to be irradiated are defined in each of the shot data, and the plurality of memories respectively store the figure data in the plurality of processed data of their corresponding data groups, and further comprising a plurality of first-in first-out (FIFO) circuits each configured, being a pair with one of the plurality of memories, to store the writing order information in each of the plurality of processed data of corresponding data groups.

15. The apparatus according to claim 14, wherein the writing order data output unit reads out the plurality of processed data from the plurality of memories and outputs them, regardless of data group and in order of writing processing, based on the writing order information output from the FIFO circuit.

16. A charged particle beam writing method for writing to regions of a target, comprising:

dividing and distributing a plurality of processed data, which were generated by respectively performing data conversion processing for writing data for each region, into a plurality of data groups each having an approximately equal data amount respectively, in a transmission side unit;

transmitting the plurality of processed data of the plurality of data groups such that at least one processed data distributed to each of the plurality of data groups is transmitted in descending order with respect to a writing order for each data group and the plurality of data groups are transmitted in parallel, from the transmission side unit;

storing in a plurality of memories in a reception side unit, the plurality of processed data of the plurality of data groups, which have been transmitted in parallel, such that processed data of each different one of the plurality of data groups is stored, in the reception side unit;

reading out the plurality of processed data from the plurality of memories and outputting them, regardless of data group and in order of writing processing, in the reception side unit; and writing a pattern on a target workpiece with a charged particle beam, based on each of the plurality of processed data output in the order of writing processing.

17. A charged particle beam writing apparatus for writing to small regions of a target, comprising:

a control computer unit configured to perform data conversion processing in parallel for writing data for each small region made by virtually dividing a writing region into a plurality of small regions, and transfer in parallel a plurality of processed data for which the data conversion processing has been performed;

a transmission side unit configured to transmit in parallel the plurality of processed data which have been transferred in parallel from the control computer unit;

a reception side unit configured to receive the plurality of processed data transmitted in parallel from the transmission side unit; and a writing unit configured to write a pattern on a target workpiece with a charged particle beam, wherein the control computer unit includes:

a plurality of CPUs configured to perform in parallel data conversion processing for the writing data for the each small region, and a plurality of memories configured to store the plurality of processed data for which data conversion processing has been performed by the plurality of CPUs, the transmission side unit includes:

a plurality of memories configured to store the plurality of processed data stored in the plurality of memories in the control computer unit, a division/distribution processing unit configured to divide and distribute the plurality of processed data into a plurality of data groups each having an approximately equal data amount respectively, a plurality of memory control units each configured to control each of the plurality of processed data stored in the plurality of memories by defining in sequence addresses of the plurality of processed data, having been divided and distributed to each of the plurality of data groups, such that order of writing processing of the plurality of processed data having been divided and distributed is a descending order, and a plurality of transmitting units configured to transmit the plurality of processed data of the plurality of data groups such that at least one processed data which has been divided and distributed to each of the plurality of data groups is transmitted in descending order with respect to the order of writing processing for each data group and the plurality of data groups are transmitted in parallel, and the reception side unit includes:

a plurality of memories configured to store the plurality of processed data of the plurality of groups having been transmitted in parallel such that processed data of each different one of the plurality of data groups is stored, a plurality of first-in first-out (FIFO) circuits each configured, being a pair with one of the plurality of memories in the reception side unit, to store writing order information in each of the plurality of processed data of corresponding data groups, and a writing order data output unit configured to input in order the writing order information of each of the plurality of processed data from each of the plurality of FIFO circuits, and read out the plurality of processed data from the plurality of memories and output them, regardless of data group and in the order of writing processing, based on the writing order information, having been input in order, of the plurality of processed data, and the writing unit writes the pattern on the target workpiece with the charged particle beam, based on each of the plurality of processed data output in the order of writing processing.

*18. A charged particle beam writing apparatus for writing to small regions of a target, comprising:*

*a transmission side circuitry configured to transmit a plurality of processed data, which were generated by performing data conversion processing in parallel for writing data for each small region made by virtually dividing a writing region into a plurality of small regions;*

*a reception side circuitry configured to receive the plurality of processed data;*

*a division/distribution processing circuitry arranged in the transmission side circuitry and configured to divide and distribute the plurality of processed data into a plurality of data groups each having an approximately equal data amount respectively;*

*a plurality of transmitting circuitries arranged in the transmission side circuitry and configured to transmit the plurality of processed data of the plurality of data groups such that at least one processed data which has been divided and distributed to each of the plurality of data groups is transmitted in sequence of writing order for each data group and the plurality of data groups are transmitted in parallel;*

*a plurality of memories arranged in the reception side circuitry and configured to store the plurality of processed data of the plurality of data groups having been transmitted in parallel such that each of the plurality of memories stores processed data of each different one of the plurality of data groups;*

*a writing order data output circuitry arranged in the reception side circuitry and configured to read out the plurality of processed data from the plurality of memories and output them, regardless of data group and in order of writing processing; and*

*a writing mechanism including a charged particle beam source, a deflector, and a stage on which the target object is placed, configured to write a pattern on a target workpiece with a charged particle beam, based on each of the plurality of processed data output in the order of writing processing.*

*19. The apparatus according to claim 18 further comprising:*

*a control computer configured to perform data conversion processing in parallel for the writing data for the each small region,*

*wherein the transmission side circuitry transmits the plurality of processed data generated by performing the data conversion processing in parallel by the control computer.*

*20. The apparatus according to claim 19,*

*wherein the control computer includes a plurality of processors for performing data conversion processing and a plurality of memories corresponding to the plurality of processors, and*

*the plurality of processed data, for which data conversion processing has been performed by the plurality of processors, are respectively stored in each corresponding memory of the plurality of memories so as to configure a data block in the each corresponding memory.*

*21. The apparatus according to claim 18 further comprising:*

*a second transmission side circuitry, when defining the transmission side circuitry according to claim 18 as a first transmission side circuitry, configured to include a division/distribution processing circuitry which is similar to the division/distribution processing circuitry according to claim 18, and a plurality of transmitting circuitries which are similar to the plurality of transmitting circuitries according to claim 18,*

*wherein the first transmission side circuitry transmits the plurality of processed data from its own plurality of transmitting circuitries respectively, in parallel with the second transmission side circuitry, and*

*each of the plurality of memories stores processed data of each of the plurality of data groups transmitted in parallel from the first and second transmission side circuitries such that the processed data is stored in a different memory for each of the plurality of data groups and each of the first and second transmission side circuitries.*

*22. The apparatus according to claim 21 further comprising:*

*first and second control computers each configured to perform data conversion processing in parallel for the writing data for the each small region,*

*wherein the first transmission side circuitry transmits a plurality of processed data generated by performing the data conversion processing in parallel by the first control computer, and*

*the second transmission side circuitry transmits a plurality of processed data generated by performing the data conversion processing in parallel by the second control computer.*

*23. The apparatus according to claim 22,*

*wherein each of the first and second control computers includes a plurality of processors for performing data conversion processing and a plurality of memories corresponding to the plurality of processors, and*

*the plurality of processed data, for which data conversion processing has been performed by the plurality of processors, are respectively stored in each corresponding memory of the plurality of memories so as to configure a data block in the each corresponding memory.*

*24. A charged particle beam writing apparatus for writing to small regions of a target, comprising:*

*a control computer configured to perform data conversion processing in parallel for writing data for each small region made by virtually dividing a writing region into a plurality of small regions, and transfer in parallel a plurality of processed data for which the data conversion processing has been performed;*

*a transmission side circuitry configured to transmit in parallel the plurality of processed data which have been transferred in parallel from the control computer;*

*a reception side circuitry configured to receive the plurality of processed data transmitted in parallel from the transmission side circuitry; and*

*a writing mechanism including a charged particle beam source, a deflector, and a stage on which the target object is placed, configured to write a pattern on a target workpiece with a charged particle beam,*

*wherein the control computer includes:*

*a plurality of processors configured to perform in parallel data conversion processing for the writing data for the each small region, and*

*a plurality of memories configured to store the plurality of processed data for which data conversion processing has been performed by the plurality of processors,*

*the transmission side circuitry includes:*

*a plurality of memories configured to store the plurality of processed data stored in the plurality of memories in the control computer,*

*a division/distribution processing circuitry configured to divide and distribute the plurality of processed data into a plurality of data groups each having an approximately equal data amount respectively,*

*a plurality of memory control circuitries each configured to control each of the plurality of processed data stored in the plurality of memories by defining in sequence addresses of the plurality of processed data, having been divided and distributed to each of the plurality of data groups, such that order of writing processing of the plurality of processed data having been divided and distributed is a descending order, and*

*a plurality of transmitting circuitries configured to transmit the plurality of processed data of the plurality of data groups such that at least one processed data which has been divided and distributed to each of the plurality of data groups is transmitted in order of the addresses defined in sequence for each data group and the plurality of data groups are transmitted in parallel, and*

*the reception side circuitry includes:*

*a plurality of memories configured to store the plurality of processed data of the plurality of groups having been transmitted in parallel such that processed data of each different one of the plurality of data groups is stored,*

*a plurality of first-in first-out (FIFO) circuits each configured, being a pair with one of the plurality of memories in the reception side circuitry, to store writing order information in each of the plurality of processed data of corresponding data groups, and*

*a writing order data output circuitry configured to input in order the writing order information of each of the plurality of processed data from each of the plurality of FIFO circuits, and read out the plurality of processed data from the plurality of memories and output them, regardless of data group and in the order of writing processing, based on the writing order information, having been input in order, of the plurality of processed data, and*

*the writing mechanism writes the pattern on the target workpiece with the charged particle beam, based on each of the plurality of processed data output in the order of writing processing.*

* * * * *